US012813352B2

(12) United States Patent
Lau et al.

(10) Patent No.: US 12,813,352 B2
(45) Date of Patent: Nov. 24, 2026

(54) PACKAGE STRUCTURE AND MANUFACTURING METHOD THEREOF

(71) Applicant: Unimicron Technology Corp., Taoyuan City (TW)

(72) Inventors: John Hon-Shing Lau, Taoyuan City (TW); Pu-Ju Lin, Hsinchu City (TW); Kai-Ming Yang, Hsinchu County (TW); Chen-Hao Lin, Keelung City (TW); Cheng-Ta Ko, Taipei City (TW); Tzyy-Jang Tseng, Taoyuan City (TW)

(73) Assignee: Unimicron Technology Corp., Taoyuan City (TW)

( * ) Notice: Subject to any disclaimer, the term of this patent is extended or adjusted under 35 U.S.C. 154(b) by 294 days.

(21) Appl. No.: 18/633,524

(22) Filed: Apr. 12, 2024

(65) Prior Publication Data

US 2025/0323232 A1 Oct. 16, 2025

(51) Int. Cl.
*H10W 90/00* (2026.01)
*G02B 6/12* (2006.01)
(Continued)

(52) U.S. Cl.
CPC ........ *H10W 90/00* (2026.01); *G02B 6/12004* (2013.01); *G02B 6/13* (2013.01);
(Continued)

(58) Field of Classification Search
CPC ........ G02B 6/428; G02B 6/43; G02B 6/4274; G02B 6/4214; G02B 6/30; G02B 6/12004;
(Continued)

(56) References Cited

U.S. PATENT DOCUMENTS 12,147,073 B1 * 11/2024 Doerr ........................ G02B 6/12
12,222,545 B2 * 2/2025 Tai ........................... G02B 6/13
(Continued)

FOREIGN PATENT DOCUMENTS

CN 112578509 3/2021
CN 115312497 11/2022
(Continued)

OTHER PUBLICATIONS

Koichi Takemura et al., "Silicon-Photonics-Embedded Interposers as Co-Packaged Optics Platform", Transactions of The Japan Institute of Electronics Packaging, Apr. 20, 2022, pp. E21-012-1 to E21-012-13, vol. 15.

*Primary Examiner* — Michelle R Connelly
(74) *Attorney, Agent, or Firm* — JCIPRNET

(57) ABSTRACT

A package structure includes a circuit board, a glass interposer, a first film redistribution layer, a second film redistribution layer, an application specific integrated circuit (ASIC) assembly, a photonic integrated circuit (PIC) assembly, an electronic integrated circuit (EIC) assembly and an optical fiber assembly. The glass interposer includes a cavity and a through glass via (TGV). The first film redistribution layer and the second film redistribution layer are respectively disposed on an upper surface and a lower surface of the glass interposer and electrically connected to the TGV. The ASIC assembly is disposed on and electrically connected to the first film redistribution layer. The PIC assembly is disposed in the cavity and electrically connected to the first film redistribution layer. The EIC assembly is stacked and electrically connected to the PIC assembly. The optical fiber assembly is disposed on the glass interposer and optically connected to the PIC assembly.

10 Claims, 8 Drawing Sheets

(51) Int. Cl.

| | |
|---|---|
| ***G02B 6/13*** | (2006.01) |
| ***H10W 70/60*** | (2026.01) |
| ***H10W 70/685*** | (2026.01) |
| ***H10W 72/00*** | (2026.01) |

(52) U.S. Cl.
CPC ........ *H10W 70/611* (2026.01); *H10W 70/685* (2026.01); *H10W 90/401* (2026.01); *H10W 90/701* (2026.01); *H10W 72/877* (2026.01); *H10W 90/722* (2026.01); *H10W 90/724* (2026.01); *H10W 90/734* (2026.01); *H10W 90/792* (2026.01)

(58) Field of Classification Search
CPC .. G02B 6/4206; G02B 6/4249; G02B 6/4204; G02B 6/4239; G02B 6/12002; G02B 6/4245; G02B 6/13; H10W 90/00; H10W 90/724; H10W 70/611; H10W 70/65; H10W 70/635; H10W 70/60; H05K 1/0274; H05K 2201/10121; H05K 2201/10378
See application file for complete search history.

(56) References Cited

U.S. PATENT DOCUMENTS

| | | | | |
|---|---|---|---|---|
| 12,399,334 | B2 * | 8/2025 | Karhade | G02B 6/4256 |
| 12,422,615 | B2 * | 9/2025 | Pietambaram | G02B 6/12004 |
| 12,453,210 | B2 * | 10/2025 | Byrd | G02B 6/428 |
| 12,455,420 | B2 * | 10/2025 | Yu | G02B 6/13 |
| 12,554,077 | B2 * | 2/2026 | Raghunathan | G02B 6/4206 |
| 2014/0203175 | A1 * | 7/2014 | Kobrinsky | G02B 6/12004 250/214.1 |
| 2016/0216445 | A1 * | 7/2016 | Thacker | G02B 6/12004 |
| 2022/0397726 | A1 | 12/2022 | Karhade et al. | |
| 2024/0176068 | A1 * | 5/2024 | Li | G02B 6/43 |
| 2024/0327201 | A1 * | 10/2024 | Ahmed | B81C 1/00325 |
| 2024/0337799 | A1 * | 10/2024 | Ravichandran | G02B 6/428 |
| 2024/0353614 | A1 * | 10/2024 | Bunandar | G02B 6/12002 |
| 2025/0004206 | A1 * | 1/2025 | Chiu | G02B 6/4239 |
| 2025/0004223 | A1 * | 1/2025 | Li | G02B 6/30 |
| 2025/0300148 | A1 * | 9/2025 | Li | G02B 6/4274 |

FOREIGN PATENT DOCUMENTS

| | | |
|---|---|---|
| TW | 202245162 | 11/2022 |
| TW | 202322327 | 6/2023 |

* cited by examiner

PACKAGE STRUCTURE AND MANUFACTURING METHOD THEREOF

BACKGROUND

Technical Field

The disclosure relates to a semiconductor structure and a manufacturing method thereof, and in particular relates to a package structure and a manufacturing method thereof.

Description of Related Art

High-performance computing (HPC) has become increasingly popular and is widely used in advanced network and server applications, particularly in products related to artificial intelligence (AI) that require high data rates, gradually increasing bandwidth, and progressively decreasing latency. In recent years, the co-packaged optics (CPO) architecture has emerged, where application specific integrated circuit (ASIC) assembly, electronic integrated circuit (EIC) assembly, and photonic integrated circuit (PIC) assembly are placed side by side on a CPO substrate with thin film redistribution layer to electrically connect to each other through the thin film redistribution layer to achieve optical/electrical signal conversion.

The expectations and requirements for the high-density (HD) packaging carriers adopted in package structures including high-performance computing (HPC) are increasingly growing. For example, the requirements for the line width and line spacing of the metal layer are becoming increasingly stringent, and the demands for the dielectric layer thickness of the reconfigurable routing layer are progressively thinner. The current build-up package substrate cannot meet the above requirements. Some industries have further proposed adding a through silicon via (TSV) interposer to the build-up package substrate. Although the TSV interposer may solve the above problems, the price of the TSV interposer is very expensive. In addition, because the ASIC assembly, EIC assembly, and PIC assembly are placed side by side, the area of the required thin film redistribution layer is large, thereby the area of the package substrate cannot be reduced.

SUMMARY

A package structure that may solve the problems of the prior art and may have lower cost and higher density and performance, is provided in the disclosure.

A manufacturing method for a package structure, which is configured to manufacture the above-mentioned package structure, is also provided in the disclosure.

The package structure of the disclosure includes a circuit board, a glass interposer, a first film redistribution layer, a second film redistribution layer, an application specific integrated circuit assembly, a photonic integrated circuit assembly, an electronic integrated circuit assembly, and an optical fiber assembly. The glass interposer is disposed on the circuit board and is electrically connected to the circuit board. The glass interposer includes an upper surface and a lower surface opposite to each other, a cavity extending from the upper surface to the lower surface, and at least one through glass via penetrating the glass interposer and connected to the upper surface and the lower surface. The first thin film redistribution layer is disposed on the upper surface of the glass interposer and is electrically connected to an end of the at least one through glass via. The second thin film redistribution layer is disposed on the lower surface of the glass interposer and is electrically connected to another end of the at least one through glass via. The application specific integrated circuit assembly is disposed on the first thin film redistribution layer and is electrically connected to the first thin film redistribution layer. The photonic integrated circuit assembly is disposed in the cavity of the glass interposer and is electrically connected to the first thin film redistribution layer. The electronic integrated circuit assembly is stacked on the photonic integrated circuit assembly and is electrically connected to the photonic integrated circuit assembly. The optical fiber assembly is disposed on the glass interposer and optically connected to the photonic integrated circuit assembly.

In an embodiment of the disclosure, the optical fiber assembly includes multiple glass waveguides, an optical coupler, and an optical fiber cable. The glass waveguides are disposed on the glass interposer and extend to connect to the photonic integrated circuit assembly. The optical fiber cable passes through the optical coupler and optically connects to the photonic integrated circuit assembly through the glass waveguides.

In an embodiment of the disclosure, the photonic integrated circuit assembly includes at least one photodiode and at least one laser diode. The glass waveguides are connected to the at least one photodiode and the at least one laser diode.

In an embodiment of the disclosure, the package structure further includes multiple connecting members disposed between the second thin film redistribution layer and the circuit board, in which the second thin film redistribution layer is electrically connected to the circuit board through the connecting members.

In an embodiment of the disclosure, the package structure further includes multiple connecting members disposed between the application specific integrated circuit assembly and the first thin film redistribution layer, in which the application specific integrated circuit assembly is electrically connected to the first thin film redistribution layer through the connecting members.

In an embodiment of the disclosure, the package structure further includes multiple connecting members disposed between the electronic integrated circuit assembly and the photonic integrated circuit assembly, in which the electronic integrated circuit assembly is electrically connected to the photonic integrated circuit assembly through the connecting members.

In an embodiment of the disclosure, the photonic integrated circuit assembly includes multiple first pads, and the electronic integrated circuit assembly includes multiple second pads. The first pads and the second pads are hybridly bonded to form a hybrid bonding pad, so that the electronic integrated circuit assembly is electrically connected to the photonic integrated circuit assembly.

In one embodiment of the disclosure, the package structure further includes an adhesive layer disposed in the cavity of the glass interposer, in which the photonic integrated circuit assembly is fixed in the cavity through the adhesive layer.

In an embodiment of the disclosure, the package structure further includes a colloid filled in the cavity of the glass interposer to cover a surrounding surface of the photonic integrated circuit assembly.

The manufacturing method of the package structure of the disclosure includes the following operation. A glass interposer is provided. The glass interposer includes an upper surface and a lower surface opposite to each other, a cavity extending from the upper surface to the lower surface, and at least one through glass via penetrating the glass interposer and connected to the upper surface and the lower surface. A photonic integrated circuit assembly is disposed in the cavity of the glass interposer. An optical fiber assembly is disposed on the glass interposer, and the optical fiber assembly is optically connected to the photonic integrated circuit assembly. A first thin film redistribution layer is formed on the upper surface of the glass interposer. The first thin film redistribution layer is electrically connected to an end of the at least one through glass via and the photonic integrated circuit assembly. An application specific integrated circuit assembly is disposed on the first thin film redistribution layer. The application specific integrated circuit assembly is electrically connected to the first thin film redistribution layer. An electronic integrated circuit assembly is stacked on the photonic integrated circuit assembly. The electronic integrated circuit assembly is electrically connected to the photonic integrated circuit assembly. A second thin film redistribution layer is formed on the lower surface of the glass interposer. The second film redistribution layer is electrically connected to another end of the at least one through glass via. The glass interposer is disposed on a circuit board. The glass interposer is electrically connected to the circuit board.

Based on the above, in the package structure of the disclosure, application specific integrated circuit assembly, electronic integrated circuit assembly, and photonic integrated circuit assembly are heterogeneously integrated on the glass interposer through the film redistribution layer, and the optical fiber assembly is disposed on the glass interposer and optically connected to the photonic integrated circuit assembly. Compared with the existing technology that uses build-up package substrates or through silicon via interposers, the package structure of the disclosure may not only meet people expectations and requirements for high-density package structures, but also has lower cost and high performance.

In order to make the above-mentioned features and advantages of the disclosure comprehensible, embodiments accompanied with drawings are described in detail below.

DETAILED DESCRIPTION OF DISCLOSED EMBODIMENTS

The embodiments of the disclosure may be understood together with the drawings, and the drawings of the disclosure are also regarded as a part of the disclosure. It should be understood that the drawings of the disclosure are not drawn to scale and, in fact, the dimensions of elements may be arbitrarily expanded or reduced in order to clearly represent the features of the disclosure.

Unless expressly stated otherwise, directional terms (e.g., up, down, left, right, top, bottom) as used herein are used for reference only to the drawings and are not intended to imply absolute orientation. In addition, unless expressly stated otherwise, any method described herein is in no way intended to be construed as requiring execution of its steps in a particular order.

FIG. 1A to FIG. 1G are cross-sectional schematic diagrams of a manufacturing method for a package structure according to an embodiment of the disclosure. FIG. 1H is a top schematic diagram of area A in FIG. 1G.

Figure 1A:
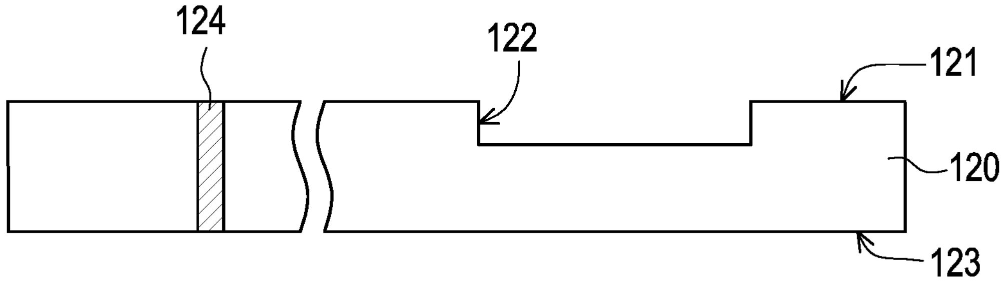
FIG. 1A to FIG. 1G are cross-sectional schematic diagrams of a manufacturing method for a package structure according to an embodiment of the disclosure.

According to the manufacturing method of the package structure of this embodiment, firstly, please refer to FIG. 1A. A glass interposer 120 is provided. The glass interposer 120 includes an upper surface 121 and a lower surface 123 that are opposite to each other, a cavity 122 extending from the upper surface 121 to the lower surface 123, and at least one through glass via (one through glass via 124 is schematically shown) penetrating the glass interposer 120 and connected to the upper surface 121 and the lower surface 123.

Figure 1B:
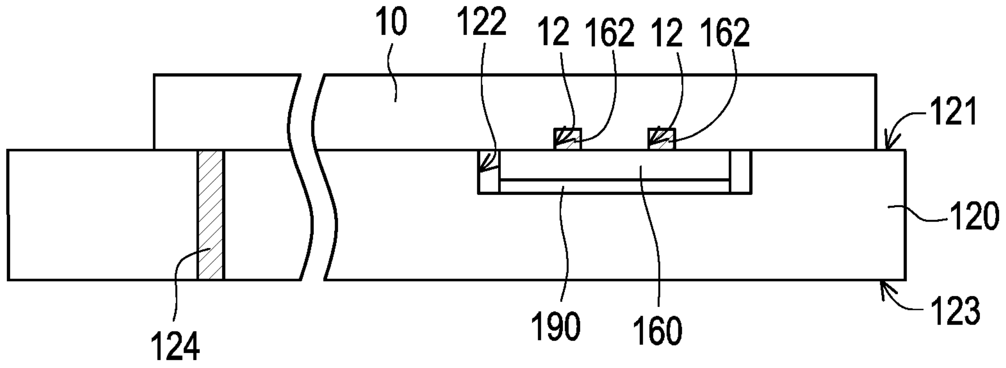

Next, referring to FIG. 1B, a photonic integrated circuit assembly 160 is disposed in the cavity 122 of the glass interposer 120 through a holding device 10, in which an adhesive layer 190 is disposed in the cavity 122 of the glass interposer 120, and the photonic integrated circuit assembly 160 is fixed in the cavity 122 through the adhesive layer 190. In one embodiment, the holding device 10 has multiple holding parts 12. The pads 162 (Cu-pillar with solder cap) of the photonic integrated circuit assembly 160 may be embedded in the holding parts 12 of the holding device 10 and disposed in the cavity 122 of the glass interposer 120 through the holding device 10. In one embodiment, the adhesive layer 190 is, for example, a die-attach film (DAF), but not limited thereto.

Figure 1C:
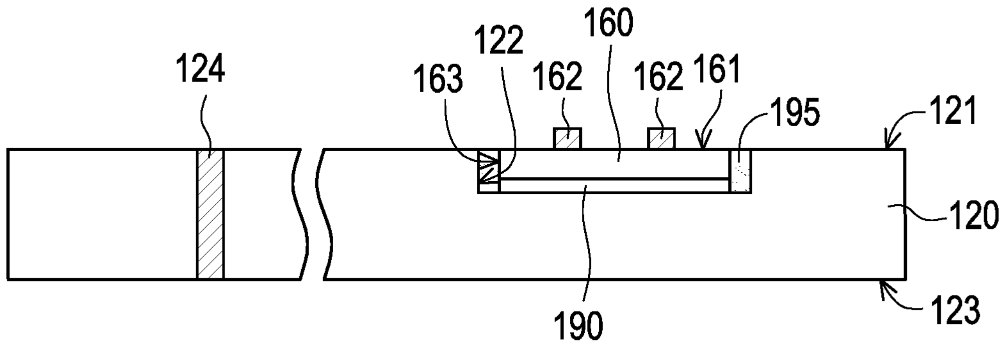

Next, referring to FIG. 1B and FIG. 1C at the same time, the holding device 10 is removed to expose the pads 162 of the photonic integrated circuit assembly 160. Here, the pads 162 of the photonic integrated circuit assembly 160 protrude from the active surface 161 of the photonic integrated circuit assembly 160.

Next, referring to FIG. 1C, a colloid 195 is filled in the cavity 122 of the glass interposer 120 to cover a surrounding surface 163 of the photonic integrated circuit assembly 160. In one embodiment, the colloid 195 is coplanar with the active surface 161 of the photonic integrated circuit assembly 160, that is, the colloid 195 exposes the pads 162 of the photonic integrated circuit assembly 160. In one embodiment, the material of the colloid 195 is, for example, epoxy molding compound (EMC), but not limited thereto.

Figure 1D:
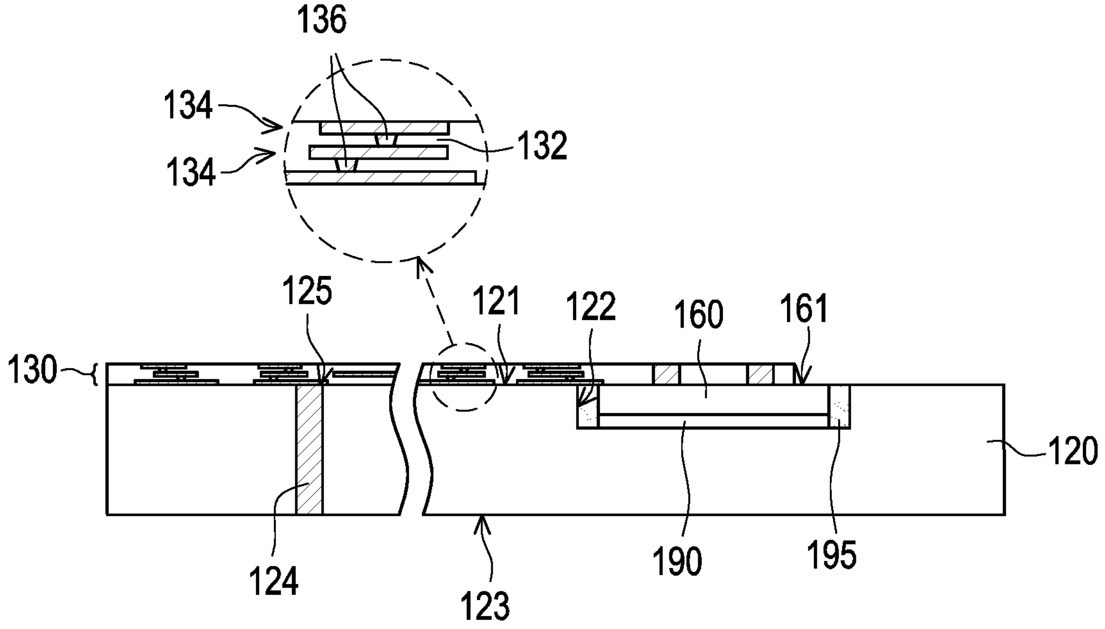

Next, referring to FIG. 1D, a first thin film redistribution layer 130 is formed on the upper surface 121 of the glass interposer 120. The first thin film redistribution layer 130 is electrically connected to an end 125 of the through glass via 124 and the photonic integrated circuit assembly 160. In an embodiment, the first thin film redistribution layer 130 may include dielectric layers 132, conductive layers 134, and conductive holes 136. The dielectric layers 132 and the conductive layers 134 are alternately stacked, and the conductive layers 134 are electrically connected through conductive holes 136, and the conductive layers 134 may form corresponding circuits (e.g., redistributing fine circuits, bonding pads, and landing pads, etc.). The layout design of the circuit may be adjusted according to requirements and is not limited herein. For example, in the circuit of the first thin film redistribution layer 130, parts that are not connected in the figure may be electrically connected through other not-shown places and/or other conductive elements.

Figure 1E:
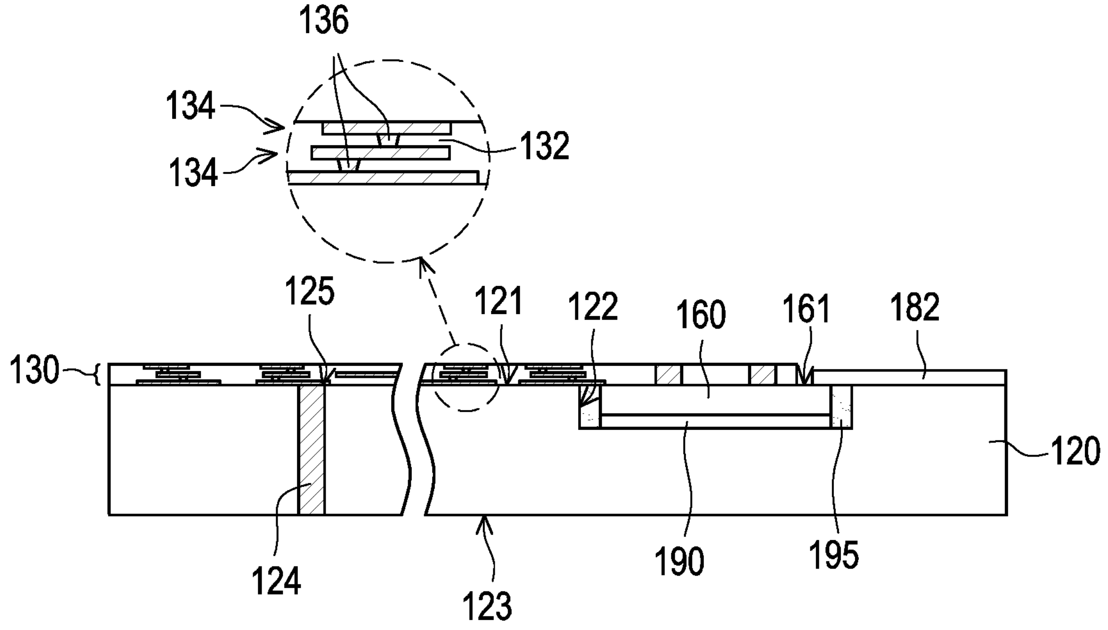
Figure 1F:
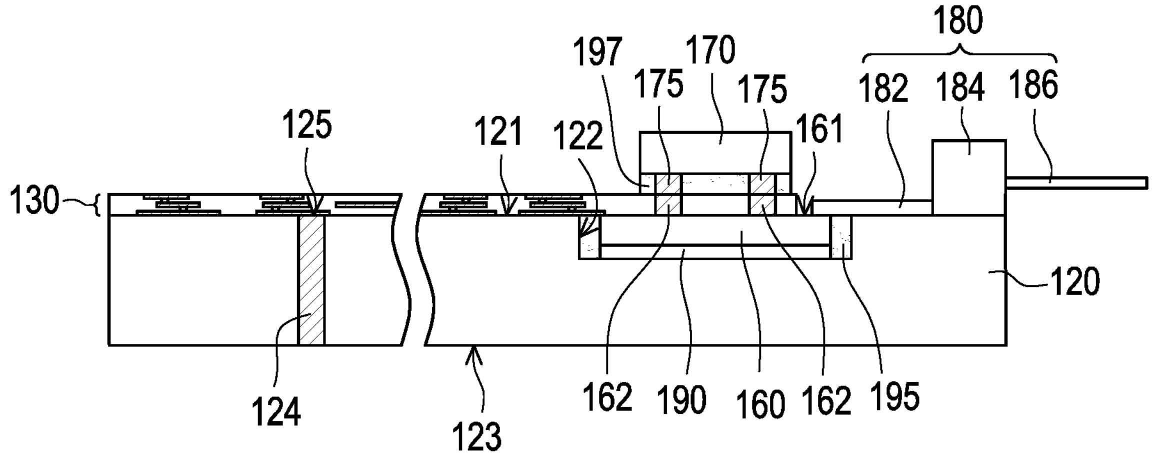

Next, referring to FIG. 1E, a glass waveguide 182 is disposed on the glass interposer 120 and extends to the active surface 161 of the photonic integrated circuit assembly 160. In one embodiment, the material of the glass waveguide 182 is, for example, polymer, but not limited thereto.

Figure 1G:
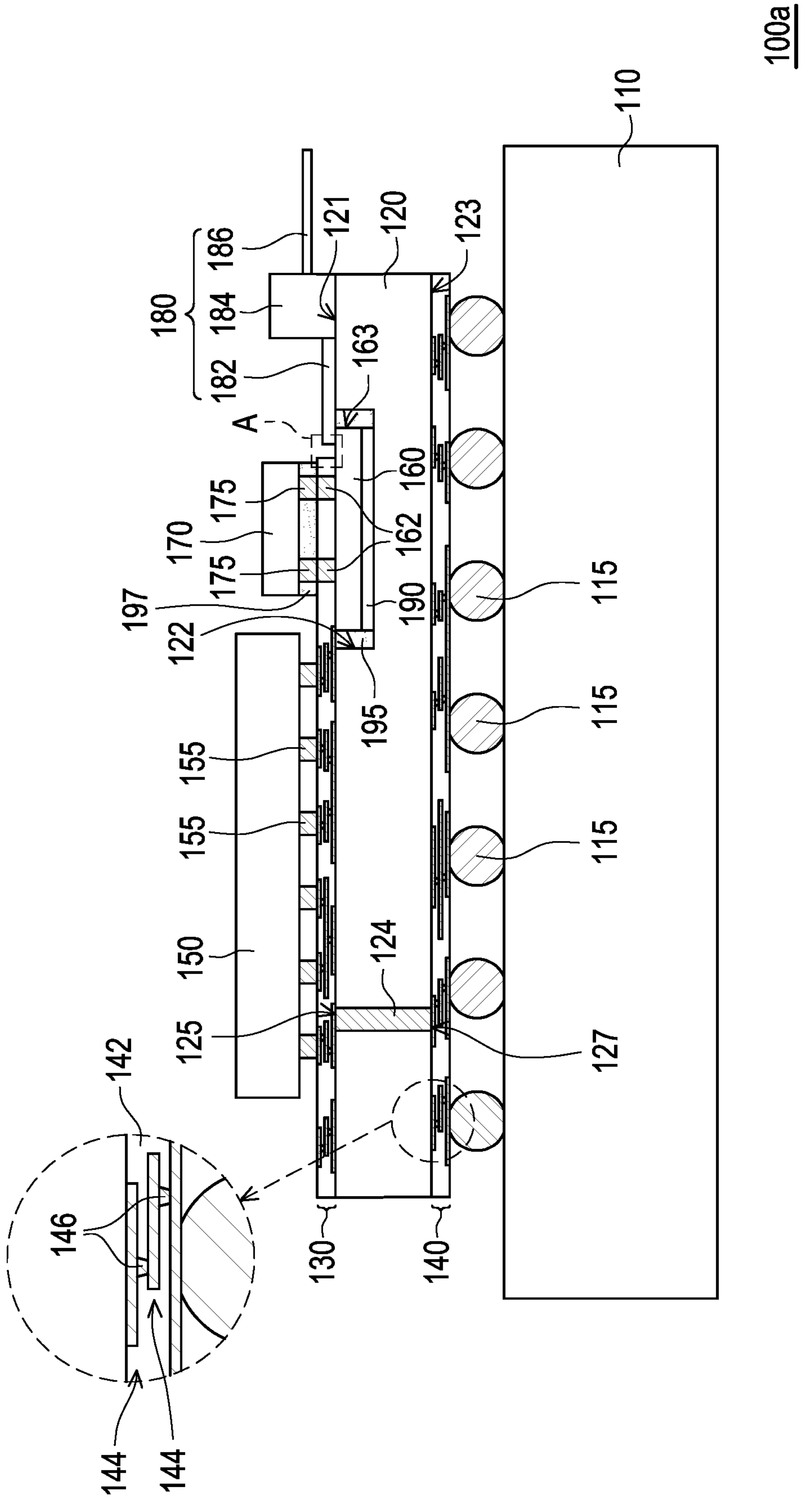
Figure 1H:
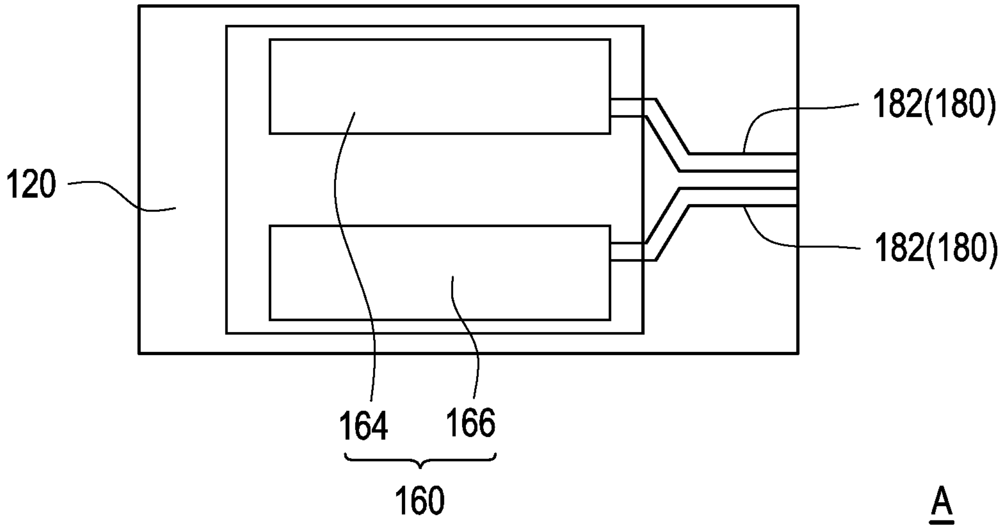
FIG. 1H is a top schematic diagram of area A in FIG. 1G.

Referring to FIG. 1E, FIG. 1G, and FIG. 1H at the same time again, in area A, the photonic integrated circuit assembly 160 includes a photodiode 164 and a laser diode 166, in which the glass waveguide 182 is connected to the photodiode 164 and the laser diode 166.

Next, referring to FIG. 1F, an electronic integrated circuit assembly 170 is stacked on the photonic integrated circuit assembly 160, in which the electronic integrated circuit assembly 170 is electrically connected to the photonic integrated circuit assembly 160 through the connecting members 175. In one embodiment, the connecting member 175 is, for example, a C2 micro bump, or a copper pillar with a solder cap, but not limited thereto. That is, the electronic integrated circuit assembly 170 of this embodiment is electrically connected to the photonic integrated circuit assembly 160 through flip-chip bonding.

In addition, in order to ensure the reliability of the electrical connection between the electronic integrated circuit assembly 170 and the photonic integrated circuit assembly 160, the package structure 100*a* of this embodiment may be provided with an underfill 197 between the electronic integrated circuit assembly 170 and the photonic integrated circuit assembly 160 to cover the connecting member 175. In one embodiment, the material of the underfill 197 may be, for example, resin, epoxy resin, or molding compound, but not limited thereto.

Next, referring to FIG. 1F again, an optical coupler 184 and an optical fiber cable 186 are disposed on the glass interposer 120, wherein the glass waveguide 182, the optical coupler 184, and the optical fiber cable 186 define as an optical fiber assembly 180, and the optical fiber assembly 180 is optically connected to the photonic integrated circuit assembly 160. In this embodiment, the optical fiber cable 186 passes through an optical coupler 184 and optically connects to photonic integrated circuit assembly 160 through the glass waveguide 182. In short, in this embodiment, photonic and electronic assemblies (i.e., the photonic integrated circuit assembly 160 and the electronic integrated circuit assembly 170) are heterogeneously integrated into the cavity 122 of the glass interposer 120 at the same time, and optical/electrical signals are transmitted through the optical fiber assembly 180 and the first thin film redistribution layer 130.

Next, referring to FIG. 1G, an application specific integrated circuit assembly 150 is disposed on the first thin film redistribution layer 130, in which the application specific integrated circuit assembly 150 is electrically connected to the first thin film redistribution layer 130 through the connecting members 155. That is, the application specific integrated circuit assembly 150 of this embodiment is electrically connected to the first thin film redistribution layer 130 through flip-chip bonding. In one embodiment, the connecting member 155 is, for example, a C2 micro bump or a copper pillar with a solder cap, but not limited thereto.

Next, referring to FIG. 1G again, a second thin film redistribution layer 140 is formed on the lower surface 123 of the glass interposer 120, in which the second thin film redistribution layer 140 is electrically connected to another end 127 of the through glass via 124. In an embodiment, the second thin film redistribution layer 140 may include dielectric layers 142, conductive layers 144, and conductive holes 146. The dielectric layers 142 and the conductive layers 144 are alternately stacked, and the conductive layers 144 are electrically connected through conductive holes 146, and the conductive layers 144 may form corresponding circuits (e.g., redistributing fine circuits, bonding pads, and landing pads, etc.). The layout design of the circuit may be adjusted according to requirements and is not limited herein. For example, in the circuit of the second thin film redistribution layer 140, parts that are not connected in the figure may be electrically connected through other not-shown places and/or other conductive elements.

Finally, referring to FIG. 1G again, the glass interposer 120 is disposed on a circuit board 110, in which the glass interposer 120 is electrically connected to the circuit board 110 through the connecting members 115. In one embodiment, the connecting member 115 is, for example, a solder ball, but not limited thereto. At this point, the production of the package structure 100*a* has been completed, in which the package structure 100*a* is a co-packaged optic (CPO).

Structurally, referring to FIG. 1G again, the package structure 100*a* of this embodiment includes a circuit board 110, a glass interposer 120, a first film redistribution layer 130, a second film redistribution layer 140, an application specific integrated circuit assembly 150, a photonic integrated circuit assembly 160, an electronic integrated circuit assembly 170, and an optical fiber assembly 180. The glass interposer 120 is disposed on the circuit board 110 and is electrically connected to the circuit board 110. The glass interposer 120 includes an upper surface 121 and a lower surface 123 that are opposite to each other, a cavity 122 extending from the upper surface 121 to the lower surface 123, and a through glass via 124 penetrating the glass interposer 120 and connected to the upper surface 121 and the lower surface 123. The first thin film redistribution layer 130 is disposed on the upper surface 121 of the glass interposer 120 and is electrically connected to an end 125 of the through glass via 124. The second thin film redistribution layer 140 is disposed on the lower surface 123 of the glass interposer 120 and is electrically connected to another end 127 of the through glass via 124. The application specific integrated circuit assembly 150 is disposed on the first thin film redistribution layer 130 and is electrically connected to the first thin film redistribution layer 130. The photonic integrated circuit assembly 160 is disposed in the cavity 122 of the glass interposer 120 and is electrically connected to the first thin film redistribution layer 130. The electronic integrated circuit assembly 170 is stacked on the photonic integrated circuit assembly 160 and is electrically connected to the photonic integrated circuit assembly 160. The optical fiber assembly 180 is disposed on the glass interposer 120 and optically connected to the photonic integrated circuit assembly 160.

In detail, the package structure 100*a* of this embodiment further includes connecting members 115 disposed between the second film redistribution layer 140 and the circuit board 110, in which the second film redistribution layer 140 is electrically connected to the circuit board 110 through the connecting members 115. In one embodiment, the connecting member 115 is, for example, a solder ball, but not limited thereto. Furthermore, the package structure 100*a* of this embodiment further includes connecting members 155 disposed between the application specific integrated circuit assembly 150 and the first thin film redistribution layer 130, in which the application specific integrated circuit assembly 150 is electrically connected to the first thin film redistribution layer 130 through the connecting members 155. In one embodiment, the connecting member 155 is, for example, a C2 micro bump, a C4 micro bump, or a copper pillar with a solder bump cap, but not limited thereto. In addition, the package structure 100*a* of this embodiment further includes connecting members 175 disposed between the electronic integrated circuit assembly 170 and the photonic integrated circuit assembly 160, in which the electronic integrated circuit assembly 170 is electrically connected to the pads 162 of the photonic integrated circuit assembly 160 through the connecting members 175. In one embodiment, the connecting member 175 is, for example, a C2 micro bump, a C4 micro bump, or a copper pillar with a solder bump cap, but not limited thereto. In order to ensure the reliability of electrical connection between the electronic integrated circuit assembly 170 and the photonic integrated circuit assembly 160, the package structure 100*a* of this embodiment may be provided with an underfill 197 between the electronic integrated circuit assembly 170 and the photonic integrated circuit assembly 160 to cover the connecting member 175.

Referring to FIG. 1G and FIG. 1H again, the optical fiber assembly 180 of this embodiment includes a glass waveguide 182, an optical coupler 184, and an optical fiber cable 186. The glass waveguide 182 is disposed on the glass interposer 120 and extends to connect to the photonic integrated circuit assembly 160. The optical fiber cable 186 passes through an optical coupler 184 and optically connects to photonic integrated circuit assembly 160 through the glass waveguide 182. The photonic integrated circuit assembly 160 includes a photodiode 164 and a laser diode 166, in which the glass waveguide 182 is connected to the photodiode 164 and the laser diode 166.

In one embodiment, the optical signal may enter from the optical fiber cable 186 to the photodiode 164, the photodiode 164 converts the optical signal into an electrical signal, and transmits it to the transimpedance amplifier through the first thin film redistribution layer 130 to amplify the electrical signal. The amplified electrical signal is then transmitted to the application specific integrated circuit assembly 150 through the first thin film redistribution layer 130. The application specific integrated circuit assembly 150 then transmits the electrical signal to the laser diode 166 through the first thin film redistribution layer 130, and emits the optical signal in the form of a laser to the optical fiber cable 186 and transmits it to the external circuit (e.g., an interconnector).

In addition, the package structure 100*a* of this embodiment further includes an adhesive layer 190 disposed in the cavity 122 of the glass interposer 120, in which the photonic integrated circuit assembly 160 is fixed in the cavity 122 through the adhesive layer 190. In addition, the package structure 100*a* of this embodiment further includes a colloid 195 filled in the cavity 122 of the glass interposer 120 to cover the surrounding surface 163 of the photonic integrated circuit assembly 160.

In short, the application specific integrated circuit assembly 150, the electronic integrated circuit assembly 170, and the photonic integrated circuit assembly 160 are heterogeneously integrated on the glass interposer 120 through the first film redistribution layer 130, and the optical fiber assembly 180 is disposed on the glass interposer 120 and optically connected to the photonic integrated circuit assembly 160. Compared with the existing technology that uses build-up package substrates or through silicon via interposers, the package structure 100*a* of the embodiment may not only meet people expectations and requirements for high-density package structures, but also has lower cost and high performance.

It is to be noted that the following embodiments use the reference numerals and a part of the contents of the above embodiments, and the same reference numerals are used to denote the same or similar elements, and the description of the same technical contents is omitted. For the description of the omitted part, reference may be made to the above embodiments, and details are not described in the following embodiments.

Figure 2A:
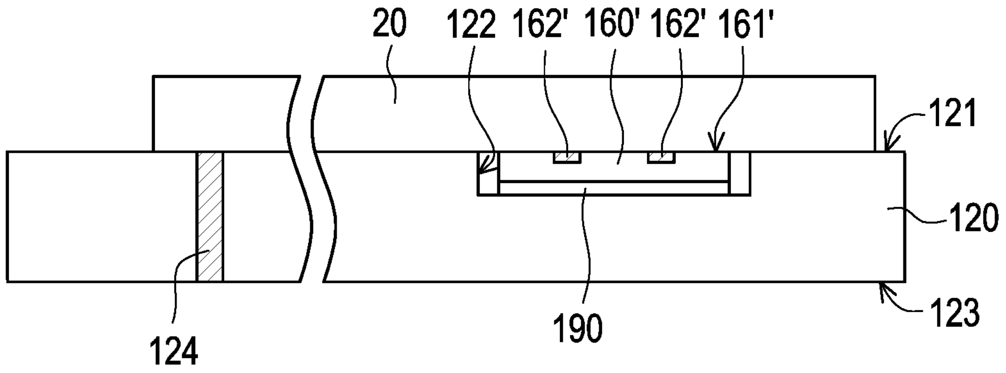
FIG. 2A to FIG. 2F are cross-sectional schematic diagrams of partial steps of a manufacturing method for a package structure according to another embodiment of the disclosure.

FIG. 2A to FIG. 2F are cross-sectional schematic diagrams of partial steps of a manufacturing method for a package structure according to another embodiment of the disclosure. Referring to FIG. 1B and FIG. 2A at the same time, the manufacturing method of the package structure of this embodiment is similar to the manufacturing method of the above-mentioned package structure. The main difference between the two is that the first pad 162' of the photonic integrated circuit assembly 160' is an embedded pad, which is embedded in the active surface 161', that is, it is flush with the active surface 161'. Therefore, a photonic integrated circuit assembly 160' is disposed in the cavity 122 of the glass interposer 120 through a holding device 20 with a planar structure, in which an adhesive layer 190 is disposed in the cavity 122 of the glass interposer 120, and the photonic integrated circuit assembly 160' is fixed in the cavity 122 through the adhesive layer 190.

Figure 2B:
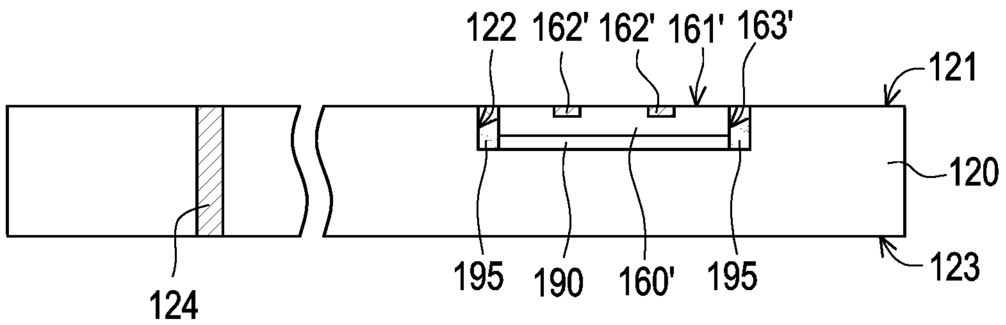

Next, referring to FIG. 2A and FIG. 2B at the same time, the holding device 20 is removed to expose the first pads 162' of the photonic integrated circuit assembly 160'. Here, the first pad 162' of the photonic integrated circuit assembly 160' is aligned with the active surface 161'.

Next, referring to FIG. 2B, a colloid 195 is filled in the cavity 122 of the glass interposer 120 to cover a surrounding surface 163' of the photonic integrated circuit assembly 160'. In one embodiment, the colloid 195 is coplanar with the active surface 161' of the photonic integrated circuit assembly 160', that is, the colloid 195 exposes the surface of the first pad 162' of the photonic integrated circuit assembly 160'.

Figure 2C:
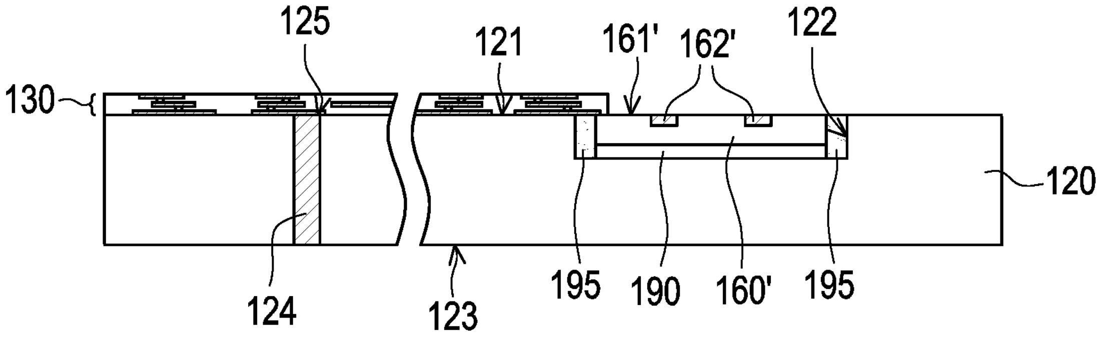

Next, referring to FIG. 2C, a first thin film redistribution layer 130 is formed on the upper surface 121 of the glass interposer 120. The first thin film redistribution layer 130 is electrically connected to the through glass via 124 and the photonic integrated circuit assembly 160'.

Figure 2D:
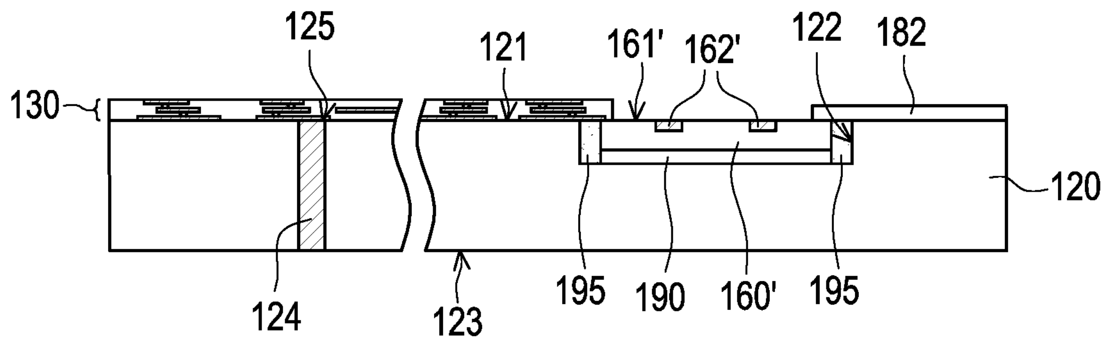

Next, referring to FIG. 2D, a glass waveguide 182 is disposed on the glass interposer 120 and extends to the active surface 161' of the photonic integrated circuit assembly 160'.

Figure 2E:
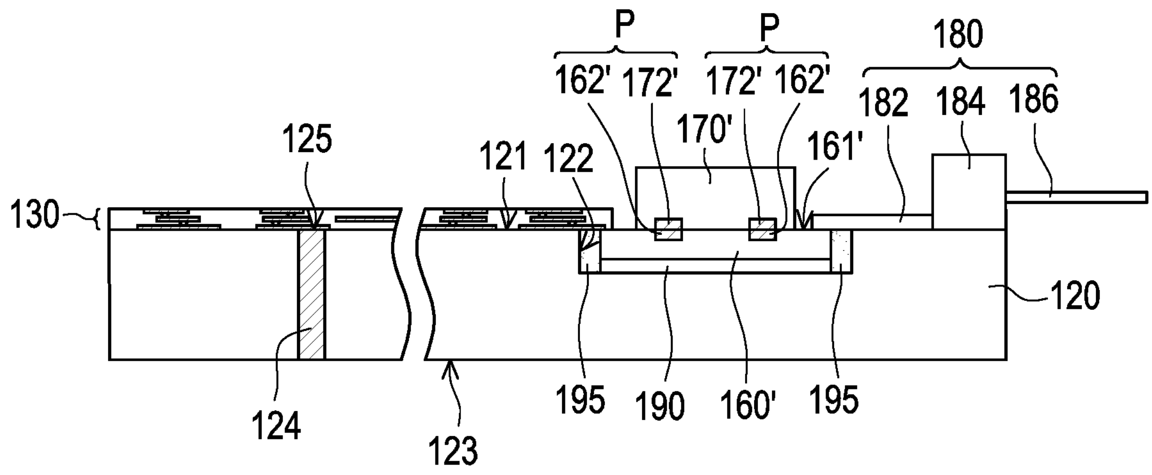

Next, referring to FIG. 2E, an electronic integrated circuit assembly 170' is stacked on the photonic integrated circuit assembly 160', in which the electronic integrated circuit assembly 170' is electrically connected to the photonic integrated circuit assembly 160'. Furthermore, the electronic integrated circuit assembly 170' includes multiple second pads 172'. The first pads 162' of the photonic integrated circuit assembly 160' are hybridly bonded with the second pad 172' of the electronic integrated circuit assembly 170' to form a hybrid bonding pad P, so that the electronic integrated circuit assembly 170' is electrically connected to the photonic integrated circuit assembly 160'. That is, the photonic integrated circuit assembly 160' and the electronic integrated circuit assembly 170' of this embodiment are electrically connected through hybrid bonding.

Next, referring to FIG. 2E again, an optical coupler 184 and an optical fiber cable 186 are disposed on the glass interposer 120, wherein the glass waveguide 182, the optical coupler 184, and the optical fiber cable 186 define as an optical fiber assembly 180. The optical fiber cable 186 passes through an optical coupler 184 and optically connects to photonic integrated circuit assembly 160' through the glass waveguide 182.

Figure 2F:
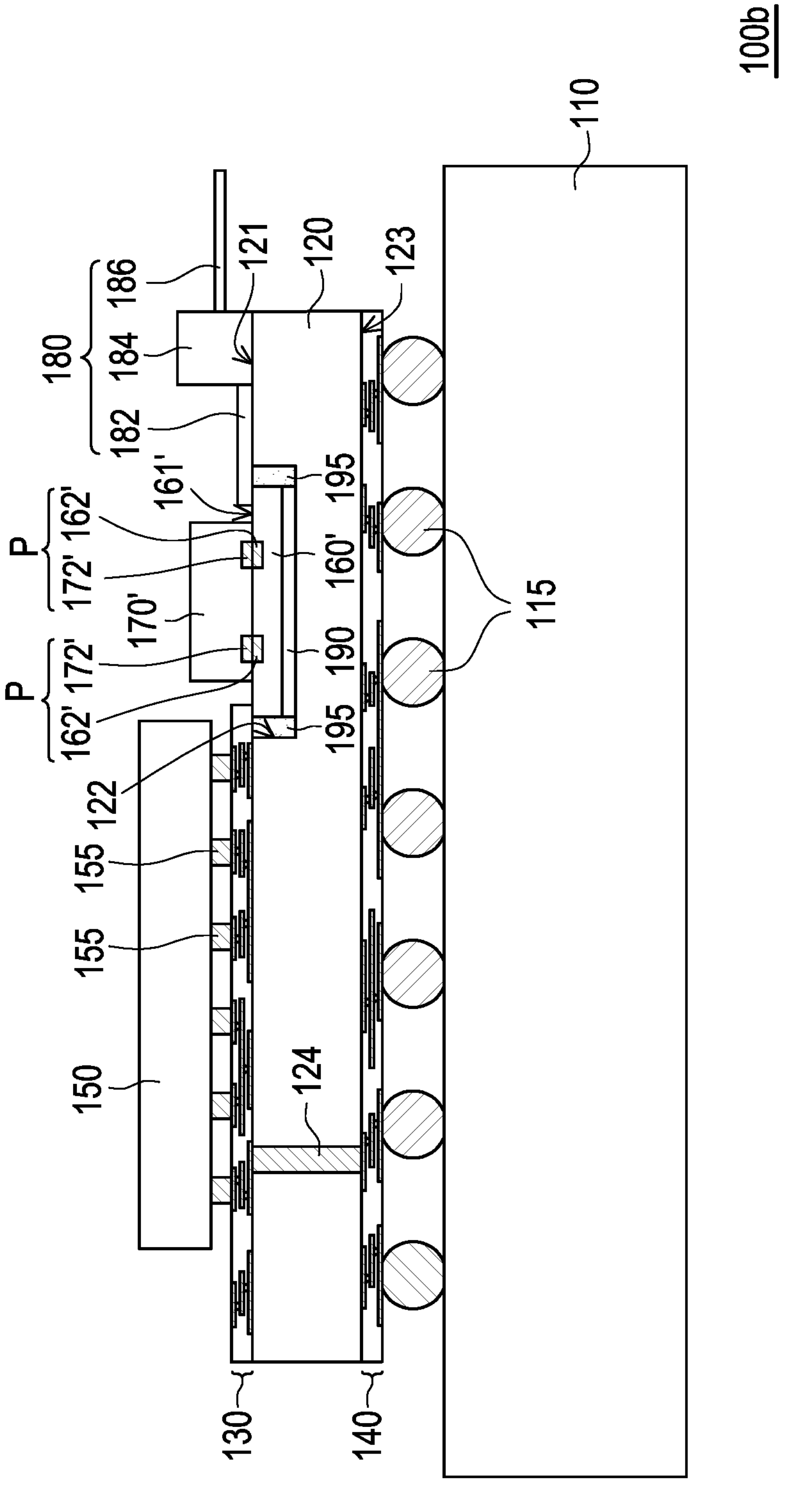

Next, referring to FIG. 2F, an application specific integrated circuit assembly 150 is disposed on the first thin film redistribution layer 130, in which the application specific integrated circuit assembly 150 is electrically connected to the first thin film redistribution layer 130 through the connecting members 155. That is, the application specific integrated circuit assembly 150 of this embodiment is electrically connected to the first thin film redistribution layer 130 through flip-chip bonding. In one embodiment, the connecting member 155 is, for example, a C2 micro bump, a C4 micro bump, or a copper pillar with a solder bump cap, but not limited thereto.

Next, referring to FIG. 2F again, a second thin film redistribution layer 140 is formed on the lower surface 123 of the glass interposer 120, in which the second thin film redistribution layer 140 is electrically connected to the through glass via 124.

Finally, referring to FIG. 2F again, the glass interposer 120 is disposed on a circuit board 110, in which the glass interposer 120 is electrically connected to the circuit board 110 through the connecting members 115. In one embodiment, the connecting member 115 is, for example, a solder ball, but not limited thereto. At this point, the production of the package structure 100*b* has been completed, in which the package structure 100*b* is a co-packaged optic (CPO).

Structurally, referring to FIG. 1G and FIG. 2F at the same time, the package structure 100*b* of this embodiment is similar to the above-mentioned package structure 100*a*. The main difference between the two is that, in this embodiment, the first pads 162' of the photonic integrated circuit assembly 160' are hybrid bonded with the second pad 172' of the electronic integrated circuit assembly 170' to form a hybrid bonding pad P, so that the electronic integrated circuit assembly 170' is electrically connected to the photonic integrated circuit assembly 160'. That is, the photonic integrated circuit assembly 160' and the electronic integrated circuit assembly 170' of this embodiment are electrically connected through hybrid bonding.

It should be noted that when the pitch between the photonic integrated circuit assembly 160 and the electronic integrated circuit assembly 170 is greater than 10 microns, the photonic integrated circuit assembly 160 and the electronic integrated circuit assembly 170 may be electrically connected through disposing the connecting members 175. Integrated circuit assembly 170. When the pitch between the photonic integrated circuit assembly 160' and the electronic integrated circuit assembly 170' is less than 10 microns, the photonic integrated circuit assembly 160' and the electronic integrated circuit assembly 170' are electrically connected through hybrid bonding.

To sum up, in the package structure of the disclosure, application specific integrated circuit assembly, electronic integrated circuit assembly, and photonic integrated circuit assembly are heterogeneously integrated on the glass interposer through the film redistribution layer, and the optical fiber assembly is disposed on the glass interposer and optically connected to the photonic integrated circuit assembly. Compared with the existing technology that uses build-up package substrates or through silicon via interposers, the package structure of the disclosure may not only meet people expectations and requirements for high-density package structures, but also has lower cost and high performance.

Although the disclosure has been described in detail with reference to the above embodiments, they are not intended to limit the disclosure. Those skilled in the art should understand that it is possible to make changes and modifications without departing from the spirit and scope of the disclosure. Therefore, the protection scope of the disclosure shall be defined by the following claims.

What is claimed is:

1. A package structure, comprising:

a circuit board;

a glass interposer, disposed on the circuit board and electrically connected to the circuit board, the glass interposer comprising an upper surface and a lower surface opposite to each other, a cavity extending from the upper surface to the lower surface, and at least one through glass via penetrating the glass interposer and connected to the upper surface and the lower surface;

a first film redistribution layer, disposed on the upper surface of the glass interposer and electrically connected to an end of the at least one through glass via;

a second film redistribution layer, disposed on the lower surface of the glass interposer and electrically connected to another end of the at least one through glass via;

an application specific integrated circuit assembly, disposed on the first thin film redistribution layer and electrically connected to the first thin film redistribution layer;

a photonic integrated circuit assembly, disposed in the cavity of the glass interposer and electrically connected to the first thin film redistribution layer, wherein the photonic integrated circuit assembly has an active surface, the active surface is flush with the upper surface of the glass interposer, and the first film redistribution layer exposes a portion of the active surface;

an electronic integrated circuit assembly, stacked on the photonic integrated circuit assembly, located on the portion of the active surface exposed by the first film redistribution layer and electrically connected to the photonic integrated circuit assembly; and an optical fiber assembly, disposed on the glass interposer and optically connected to the photonic integrated circuit assembly.

2. The package structure according to claim 1, wherein the optical fiber assembly comprises a plurality of glass waveguides, an optical coupler, and an optical fiber cable, the glass waveguides are disposed on the glass interposer and extend to connect to the photonic integrated circuit assembly, the optical fiber cable passes through the optical coupler and optically connects to the photonic integrated circuit assembly through the glass waveguides.

3. The package structure according to claim 2, wherein the photonic integrated circuit assembly comprises at least one photodiode and at least one laser diode and the glass waveguides are connected to the at least one photodiode and the at least one laser diode.

4. The package structure according to claim 1, further comprising:

a plurality of connecting members, disposed between the second thin film redistribution layer and the circuit board, wherein the second thin film redistribution layer is electrically connected to the circuit board through the connecting members.

5. The package structure according to claim 1, further comprising:

a plurality of connecting members, disposed between the application specific integrated circuit assembly and the first thin film redistribution layer, wherein the application specific integrated circuit assembly is electrically connected to the first thin film redistribution layer through the connecting members.

6. The package structure according to claim 1, further comprising:

a plurality of connecting members, disposed between the electronic integrated circuit assembly and the photonic integrated circuit assembly, wherein the electronic integrated circuit assembly is electrically connected to the photonic integrated circuit assembly through the connecting members.

7. The package structure according to claim 1, wherein the photonic integrated circuit assembly comprises a plurality of first pads, the electronic integrated circuit assembly comprises a plurality of second pads, the first pads and the second pads are hybridly bonded to form a hybrid bonding pad, so that the electronic integrated circuit assembly is electrically connected to the photonic integrated circuit assembly.

8. The package structure according to claim 1, further comprising:

an adhesive layer, disposed in the cavity of the glass interposer, wherein the photonic integrated circuit assembly is fixed in the cavity through the adhesive layer.

9. The package structure according to claim 1, further comprising:

a colloid, filled in the cavity of the glass interposer to cover a surrounding surface of the photonic integrated circuit assembly.

10. A manufacturing method of a package structure, comprising:

providing a glass interposer, the glass interposer comprising an upper surface and a lower surface opposite to each other, a cavity extending from the upper surface to the lower surface, and at least one through glass via penetrating the glass interposer and connected to the upper surface and the lower surface;

disposing a photonic integrated circuit assembly in the cavity of the glass interposer, wherein the photonic integrated circuit assembly has an active surface, the active surface is flush with the upper surface of the glass interposer;

disposing an optical fiber assembly on the glass interposer, wherein the optical fiber assembly optically connected to the photonic integrated circuit assembly;

forming a first thin film redistribution layer on the upper surface of the glass interposer, wherein the first thin film redistribution layer is electrically connected to an end of the at least one through glass via and the photonic integrated circuit assembly, wherein the first film redistribution layer exposes a portion of the active surface;

disposing an application specific integrated circuit assembly on the first thin film redistribution layer, wherein the application specific integrated circuit assembly is electrically connected to the first thin film redistribution layer;

stacking an electronic integrated circuit assembly on the photonic integrated circuit assembly, wherein the electronic integrated circuit assembly is located on the portion of the active surface exposed by the first film redistribution layer and electrically connected to the photonic integrated circuit assembly;

forming a second thin film redistribution layer on the lower surface of the glass interposer, wherein the second film redistribution layer is electrically connected to another end of the at least one through glass via; and disposing the glass interposer on a circuit board, wherein the glass interposer is electrically connected to the circuit board.

* * * * *